April 11, 1967 TSU-HSING YEH ET AL 3,313,663

INTERMETALLIC SEMICONDUCTOR BODY AND METHOD
OF DIFFUSING AN N-TYPE IMPURITY THEREINTO

Filed March 28, 1963

INVENTORS
TSU-HSING YEH
ROBERT M. DE FRIES

BY Everett A. Gartrell

ATTORNEY

United States Patent Office 3,313,663
Patented Apr. 11, 1967

3,313,663

INTERMETALLIC SEMICONDUCTOR BODY AND METHOD OF DIFFUSING AN N-TYPE IMPURITY THEREINTO

Tsu-Hsing Yeh, Poughkeepsie, and Robert M. De Fries, Hyde Park, N.Y., assignors to International Business Machines Corporation, New York, N.Y., a corporation of New York Filed Mar. 28, 1963, Ser. No. 268,667
9 Claims. (Cl. 148—187)

Figure 1:
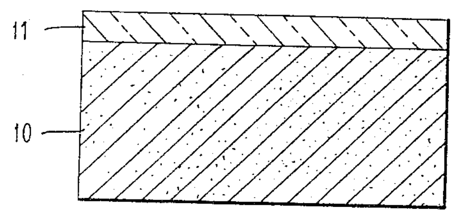

The present invention is directed to intermetallic semiconductor bodies and the methods of diffusing N-type conductivity-determining impurities thereinto. More particularly, the invention relates to semiconductor PN junction devices and the methods of forming the junctions or barriers therein by diffusing N-type impurities into P-type intermetallic semiconductor bodies.

Intermetallic compounds of two or more elements are known which exhibit the properties of semiconductor materials. One of the better known types of such compounds is the III–V group thereof. These intermetallic semiconductor bodies are binary compounds of an element of the third group of the Periodic Classification of Elements with an element of the fifth group thereof and include materials such as gallium arsenide, aluminum arsenide, indium arsenide, aluminum antimonide and indium antimonide.

For many semiconductor applications, the electrical properties of intermetallic semiconductor materials afford various advantages which make them attractive to device manufacturers. Unfortunately, however, the use of intermetallic semiconductor materials has been limited to some extent because it heretofore has not been possible to diffuse effectively an N-type impurity such as sulphur, selenium or tellurium into an intermetallic semiconductor body such as gallium arsenide to create a diffused N-type region or a PN junction. The reasons for this inability have not been clear. However, applicants have recently determined by X-ray and spectrographic studies that during such a diffusion operation there was formed on the surface of the gallium arsenide body an unwanted chemical compound, namely a chalcogenide or binary compound comprising gallium supplied by the semiconductor body and another element which constitutes the conductivity-determining impurity. This unwanted compound formed a coating which inhibited the formation of a desired PN junction in a P-type gallium arsenide body when an N-type diffusant was being employed. For example, when sulphur was the N-type diffusant, the compound gallium sulphide having the chemical formula $Ga_2S_3$ with minor amounts of GaS was formed. Similarly, when the diffusant was selenium or tellurium, gallium selenide $Ga_2Se_3$ or gallium telluride $Ga_2Te_3$, as the case may be, was created. This undesirable reaction together with the failure to produce a useful junction has proved to be frustrating to semiconductor device manufacturers.

It is an object of the present invention, therefore, to provide a new method for making an intermetallic semiconductor device which overcomes the above-mentioned disabilities of prior diffusion techniques.

It is another object of the invention to provide a new and improved method of forming a diffused N-type region in an intermetallic semiconductor body.

It is a further object of the invention to provide a new and improved technique for forming a PN junction in a P-type intermetallic semiconductor body by a diffusing operation.

It is also an object of the invention to provide a new method of forming a diffused N-type region in a P-type gallium arsenide semiconductor body.

It is an additional object of the invention to provide a simple and inexpensive method of forming a PN junction in a P-type gallium arsenide body by diffusing thereinto an N-type conductivity-directing impurity.

It is a still further object of the present invention to provide a new and improved intermetallic semiconductor having an N-type region established therein by solid-state diffusion.

In accordance with the particular form of the invention, the method of diffusing an N-type conductivity-determining impurity into an intermetallic semiconductor body comprises forming a thin coherent film of a material which is different from that of the body and is ineffective at temperatures for diffusing an impurity therein to react therewith and adversely affect the electrical properties of the body, and diffusing that impurity through the film into the body, the film preventing the substantial formation of the undesired compound which would otherwise form as a result of the chemical reaction between the impurity and an element of the body and would prevent effective diffusion of the impurity into the body.

Also in accordance with the invention, the method of forming a PN junction in a P-type intermetallic semiconductor body comprises forming a thin coherent film of a material which is different from that of the body and is ineffective at temperatures for diffusing an impurity therein to react therewith and adversely affect the electrical properties of the body, and diffusing an N-type conductivity-determining impurity through the film into the body to create the junction, the film preventing the substantial formation of an undesired compound which would otherwise form as the result of the chemical reaction between the impurity and an element of the aforesaid body and would prevent effective diffusion of the impurity into that body.

Further in accordance with the present invention, a semiconductor device comprises a body of an intermetallic semiconductor material, a thin coherent film of a material which is different from that of the body and is ineffective at temperatures for diffusing an impurity therein to react with the body and adversely affect the electrical properties thereof, an N-type diffused intermetallic semiconductor region between the body and the film and contiguous therewith, and electrical connections to the body and to the diffused region.

The foregoing and other objects, features and advantages of the invention will be apparent from the following more particular description of preferred embodiments of the invention, as illustrated in the accompanying drawing.

Figure 2:
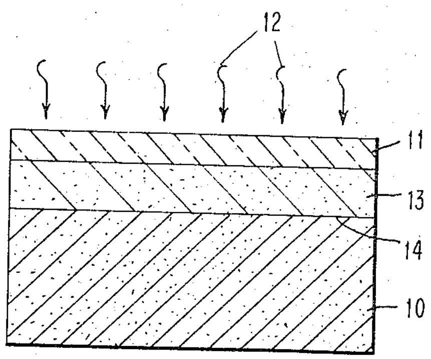
Figure 3:
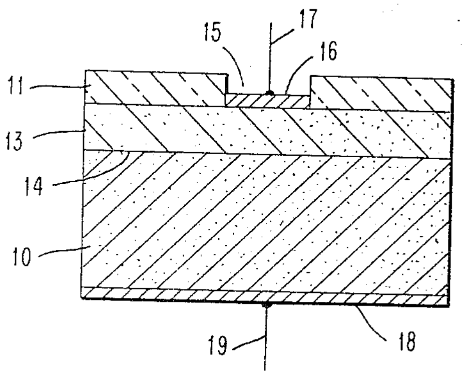
Figure 5:
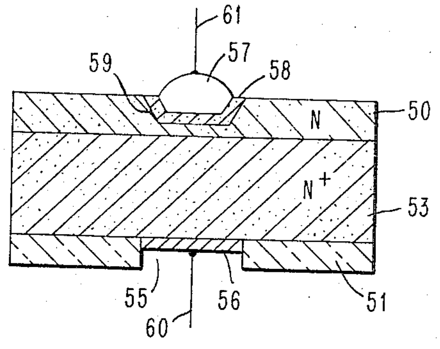
Figure 4:
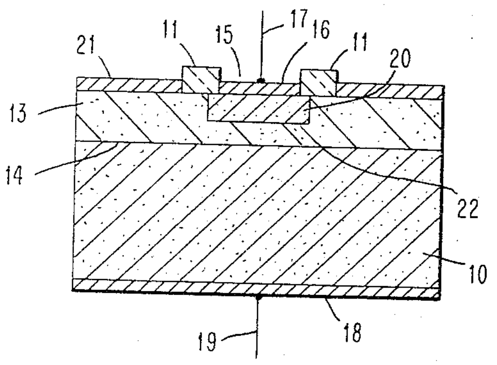

In the drawing:

FIGS. 1–3, inclusive, are cross-sectional views representing steps in the fabrication of a semiconductor diode in accordance with the present invention;

FIG. 4 is a similar view of a transistor fabricated by the techniques of the invention; and FIG. 5 is a cross-sectional view of another semiconductor diode fabricated using the procedures of this invention.

FABRICATION OF STRUCTURES OF FIGS. 1, 2, 3

Referring now more particularly to FIG. 1 of the drawing, there is represented an intermetallic semiconductor body 10 which, for the device presently under consideration, will be considered as being of P-type material. While various P-type intermetallic semiconductor bodies such as binary or ternary compounds may be employed for the body 10, Group III–V intermetallic bodies such as gallium arsenide have proved to be particularly attractive for many applications. Accordingly, for the purposes of illustration, the body 10 will be considered as being one of gallium arsenide, although it will be understood that the invention has utility with other intermetallic semiconductor materials. Suitably formed on the body 10 is a thin coherent film 11 of a material which is different from that of the body and is ineffective at temperatures for diffusing an impurity therein to react therewith and adversely affect the electrical properties of the body. A very effective film, and one which is easy to apply in a manner and at a sufficiently low temperature as to prevent dissociation of the gallium arsenside, is one of silicon monoxide. A suitable material which is sold as silicon monoxide by the Kemet Company of 30 E. 42nd St., New York, N.Y., and by Vacuum Equipment of 1325 Admiral Wilson Blvd., Camden 1, N.J., is believed to be of the mixed oxide form comprising a mixture of mainly silicon monoxide and a minor quantity of silicon dioxide, or the mixture may also contain some silicon. Such a material will be referred to hereinafter in the text and the claims as being silicon monoxide.

The film 11 of silicon monoxide may be applied to the gallium arsenide body 10 in any convenient manner such as by evaporating silicon monoxide in a conventional vaporizer which includes an evacuated chamber, a support therein for the body 11 and a filamentary cup containing the material to be vaporized by heating it to a temperature of about 1600° C. The spacing between the filamentary cup and the cooler gallium arsenide body is such that the latter is maintained below its dissociation temperature, that is below a temperature of about 400° C. The application of electrical energy to the filamentary cup evaporates or sublimes the silicon monoxide and it condenses as a thin tough film 11 which is integrally attached to the base 10. The thickness of the deposited film preferably is in the range of 2,000–20,000 angstroms for reasons to be explained hereinafter.

As represented diagrammatically in FIG. 2, the next step in the fabrication of a semiconductor device comprises diffusing in the well-known manner an N-type conductivity-determining impurity 12 through the film 11 into the body 10 to create an N-type impurity region 13 and a PN junction 14. Elements of Group VI of the Periodic Classification of Elements such as sulphur, selenium and tellurium have proved to be useful as N-type diffusants for use in connection with gallium arsenide. The diffusion operation is carried out in a conventional manner with the unit in a closed quartz capsule maintained for about 120–260 hours at an elevated temperature in the range of 950–1150° C., which is below the melting point of the silicon monoxide. Typical film thicknesses, diffusion temperatures and times are 2500 Angstroms, 1040° C. and 120 hours, respectively. A depth of diffusion that is desirable is governed primarily by the length of time that the diffusion takes place. Doping levels in the region 13 have been established which are above $10^{17}$ atoms/cu. cm., and may be in the range of $10^{17}$ atoms/cu. cm. to degeneracy. The conductivity-determining impurity may be introduced into the capsule as the powdered element or may be compounded with some gallium arsenide. A small amount of arsenic such as about 7 milligrams thereof is also introduced into the capsule so that the vapor pressure which it creates when the capsule is heated tends to suppress the dissociation of the arsenic in the gallium arsenide from that compound. The silicon monoxide film 11 is effectively inert with reference to the semiconductor body 10 at the diffusion temperature so that it does not react therewith and form undesirable compounds or released impurities which would adversely affect the electrical properties of the semiconductor body.

The exact nature of the phenomenon which occurs during the diffusion operation in the presence of and in the absence of the silicon monoxide film is not entirely clear. It is believed that at the diffusion temperature, there occurs a change in the surface composition of the gallium arsenide body such that arsenic is evaporated from that surface. This is believed to create a large number of vacancy sites which the N-type diffusant may occupy and form an undesirable compound or chalcogenide. The chalcogenides $Ga_2S_3$, $Ga_2Se_3$ or $Ga_2Te_3$ are formed depending upon whether the N-type diffusant is sulphur, selenium or tellurium. The formation of one of these compounds is believed to establish a thin film on the surface of the gallium arsenide body 10 which prevents effective diffusion into the body to create an N-type region and a PN junction.

When, however, a thin film of silicon monoxide having a thickness in the range of 2,000–20,000 angstroms is present on the semiconductor body 10 during the diffusion operation, it is believed that it prevents the escape of arsenic and the creation of arsenic vacancies in the gallium arsenide body. This in turn permits the N-type diffusant to diffuse into the P-type gallium arsenide body 10 and form the N-type region 13 and the PN junction 14. Too thin a film 11 apparently is pervious to arsenic and does not appear to be sufficiently effective to prevent the creation of arsenic vacancies. Too thick a film of silicon monoxide will prevent the N-type impurity from diffusing therethrough to form the N-type region 13 and the junction 14. However, when the film has a thickness in the range mentioned above, it performs its intended function with great reliability. By following the parameters employed in making a first batch of devices to exacting specifications, it is possible to reproduce succeeding batches to those specifications with ease. Other important benefits result from employing the technique of diffusing through the silicon monoxide film. The film serves to passivate metallurgically the surface of the gallium arsenide thereunder and to keep it desirably smooth by preventing undesirable thermal etching which would otherwise occur and pit the surface in the absence of that film during the diffusing operation. Smooth surfaces have been achieved when the depth of diffusion was as much as 0.2–0.3 mil.

Referring now to FIG. 3 of the drawing, the intermetallic semiconductor device is completed by etching a hole 15 of suitable size in the silicon monoxide film 11 with an etchant such as hydrofluoric acid, depositing as by evaporation a metallic film 16 thereon to form an ohmic contact with the region 13, and attaching a lead 17 thereto in a conventional manner. If desired, the film 16 may be alloyed with the portion of the semiconductor region thereunder. A metallic plate or film 18 is ohmically attached to the body 10 as by soldering and a lead 19 is attached to the film to complete the terminal structure of the semiconductor diode. It will be understood that in the fabrication of the device, the silicon monoxide film 11 may be removed completely, if desired, rather than having a hole etched therein. Also, if desired, the semiconductor portion of the device may be etched, prior to the formation of the terminal structures, to form a mesa device to procure desired electrical characteristics.

DESCRIPTION OF TRANSISTOR OF FIG. 4

In FIG. 4 there is represented a transistor of intermetallic material which is made in the same manner as the FIG. 3 diode but for the incorporation of an additional or emitter region 20 and a base terminal 21. After the hole 15 has been formed in the silicon monoxide film 11, a P-type impurity such as zinc or cadmium is diffused in a conventional manner into the semiconductor material exposed by the hole to create the P-type emitter region 20 and the emitter-base junction 22. Selective etching may then be performed to remove a peripheral ring of the film 11 to accommodate an ohmic base terminal 21 which is created on the semiconductor base region 13 at the same time that the ohmic emitter film or contact 16 is formed on the emitter region 20 by an evaporation operation.

DESCRIPTION OF SEMICONDUCTOR DIODE OF FIG. 5

The method of the present invention is also useful in diffusing an N-type impurity into an N-type intermetallic body to form a region of the same but higher conductivity. To that end, there is represented in FIG. 5 an intermetallic or gallium arsenide semiconductor diode having a low resistivity or N+ region 53 established on its higher resistivity N-type body 50 by diffusing an N-type impurity through a silicon monoxide film 51 in the manner explained above. An opening 55 is created in the film 51 and an ohmic contact is made to the exposed portion of region 53 by evaporating a metal film 56 thereon. When a pellet 57 of a P-type impurity comprising an alloy of gold and tin is alloyed with the higher resistivity N-type region 50, there results a P-type recrystallized region 58 and a rectifying junction 59. At the same time, the metal film 56 is alloyed with the region 53 to make a reliable ohmic contact. Leads 60 and 61 are applied in a conventional manner.

The intermetallic diode which is constructed in this manner is one which exhibits a low voltage drop in the bulk of its semiconductor material and has an improved recovery time.

While the invention has been particularly shown and described with reference to preferred embodiments thereof, it will be understood by those skilled in the art that various changes in form and details may be made therein without departing from the spirit and scope of the invention.

What is claimed is:

1. The method of diffusing an N-type conductivity-determining impurity into a III–V group intermetallic semiconductor body comprising:
   maintaining said body at a temperature below about 400° C. while forming a thin coherent film, having a thickness in the range of 2,000–20,000 angstroms, of silicon monoxide which is ineffective at temperatures for diffusing an impurity therein to react therewith and adversely affect the electrical properties of said body; and
   diffusing from a vapor source said impurity through said film into said body to establish a doping level above $10^{17}$ atoms/cubic centimeter, said film preventing the substantial formation of an undesired compound which would otherwise form as the result of a chemical reaction between said impurity and an element of said body and would prevent effective diffusion of said impurity into said body.

2. The method of forming a PN junction in a P-type gallium arsenide semiconductor body comprising:
   maintaining said body at a temperature below about 400° C. while forming on said body at a temperature of about 1600° C. a thin coherent film of silicon monoxide having a thickness in the range of 2,000–20,000 angstroms; and
   diffusing from a vapor source at a temperature between about 950° C. and 1150° C. an N-type Group VI conductivity-determining impurity through said film into said body to create said junction and to establish a doping level above $10^{17}$ atoms/cubic centimeter, said film preventing the formation of an undesired chalcogenide which would otherwise form as a result of a chemical reaction between said impurity and an element of said body and would prevent effective diffusion of said impurity into said body.

3. The method of claim 2 wherein said Group VI impurity is sulphur.

4. The method of claim 2 wherein said Group VI impurity is selenium.

5. The method of claim 2 wherein said Group VI impurity is tellurium.

6. The method of forming a PN junction in a P-type Group III–V intermetallic semiconductor body comprising:
   maintaining said body at a temperature below its dissociation temperature while forming on said body a thin coherent film of silicon monoxide having a thickness in the range of 2,000 to 20,000 angstroms; and
   diffusing from a vapor source an N-type Group VI conductivity-determining impurity through said film into said body to create said junction, and to establish a doping level above $10^{17}$ atoms/cubic centimeter, said film preventing the substantial formation of an undesired chalcogenide which would otherwise form as a result of a chemical reaction between said impurity and an element of said body, and would prevent effective diffusion of said impurity into said body.

7. The method of claim 6 wherein said Group VI impurity is sulphur.

8. The method of claim 6 wherein said Group VI impurity is selenium.

9. The method of claim 6 wherein said Group VI impurity is tellurium.

References Cited by the Examiner

UNITED STATES PATENTS

| | | | |
|---|---|---|---|
| 2,879,190 | 3/1959 | Logan et al. | 148—1.5 |
| 3,055,776 | 9/1962 | Stevenson | 148—187 X |
| 3,056,888 | 10/1962 | Atalla | 317—235 X |
| 3,070,466 | 12/1962 | Lyons | 148—1.5 |
| 3,081,421 | 3/1963 | Roka | 317—234 |
| 3,095,332 | 6/1963 | Ligenza | 148—187 |
| 3,096,219 | 7/1963 | Nelson | 148—1.5 X |
| 3,098,954 | 7/1963 | Misra | 317—234 |
| 3,138,495 | 6/1964 | Bylander | 148—187 |
| 3,139,362 | 6/1964 | D'Asavo | 148—187 |
| 3,144,366 | 8/1964 | Rideout | 148—187 X |
| 3,147,152 | 9/1964 | Mendel. | |
| 3,154,439 | 10/1964 | Robinson | 148—1.5 |

HYLAND BIZOT, *Primary Examiner.*

JAMES D. KALLAW, *Examiner.*

C. E. PUGH, *Assistant Examiner.*